US009418861B2

(12) United States Patent
Choi et al.

(10) Patent No.: US 9,418,861 B2
(45) Date of Patent: Aug. 16, 2016

(54) METHOD OF MANUFACTURING A DISPLAY SUBSTRATE USING TWO ETCH MASKS

(71) Applicant: SAMSUNG DISPLAY CO., LTD., Yongin, Gyeonggi-Do (KR)

(72) Inventors: Seung-Ha Choi, Suwon-si (KR); Kyoung-Jae Chung, Seoul (KR); Woo-Geun Lee, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 15 days.

(21) Appl. No.: 14/455,771

(22) Filed: Aug. 8, 2014

(65) Prior Publication Data

US 2014/0349445 A1 Nov. 27, 2014

Related U.S. Application Data

(62) Division of application No. 13/277,114, filed on Oct. 19, 2011, now Pat. No. 8,836,877.

(30) Foreign Application Priority Data

Nov. 9, 2010 (KR) .................. 10-2010-0111038

(51) Int. Cl.
*H01L 21/308* (2006.01)
*H01L 27/12* (2006.01)
*H01L 29/49* (2006.01)
*H01L 29/66* (2006.01)
*H01L 29/786* (2006.01)
*G02F 1/1362* (2006.01)

(52) U.S. Cl.
CPC ...... *H01L 21/3086* (2013.01); *G02F 1/136227* (2013.01); *H01L 27/1225* (2013.01); *H01L 27/1288* (2013.01); *H01L 29/4908* (2013.01); *H01L 29/66742* (2013.01); *H01L 29/66969* (2013.01); *H01L 29/7869* (2013.01)

(58) Field of Classification Search
None
See application file for complete search history.

(56) References Cited

U.S. PATENT DOCUMENTS

| 6,330,042 B1 | 12/2001 | Kang et al. | |
| 2001/0019125 A1* | 9/2001 | Hong | G02F 1/1362 257/59 |
| 2009/0009677 A1* | 1/2009 | Yamazaki | G02F 1/1368 349/43 |
| 2009/0057672 A1 | 3/2009 | Kobayashi et al. | |

(Continued)

FOREIGN PATENT DOCUMENTS

| JP | 11-281943 | 10/1999 |
| JP | 2009-021612 A | 1/2009 |

(Continued)

*Primary Examiner* — Mohammad Islam
*Assistant Examiner* — Mikka Liu
(74) *Attorney, Agent, or Firm* — Innovation Counsel LLP (57) ABSTRACT

Provided are a display substrate, a display device, and a method of manufacturing the display substrate. The display substrate includes: a substrate in which a pixel region is defined; a gate electrode and a gate pad are formed on the substrate; a gate insulating layer formed on the gate electrode and the gate pad; a buffer layer pattern overlaps the gate electrode and is formed on the gate insulating layer; an insulating film pattern formed on the buffer layer pattern; an oxide semiconductor pattern formed on the insulating film pattern; a source electrode formed on the oxide semiconductor pattern; and a drain electrode formed on the oxide semiconductor pattern and is separated from the source electrode.

14 Claims, 9 Drawing Sheets

(56) References Cited

U.S. PATENT DOCUMENTS

2009/0180045 A1    7/2009    Yoon et al.
2010/0109003 A1    5/2010    Akimoto et al.

FOREIGN PATENT DOCUMENTS

| | | |
|---|---|---|
| KR | 10-2003-0022692 A | 3/2003 |
| KR | 10-2008-0067852 A | 7/2008 |

* cited by examiner

METHOD OF MANUFACTURING A DISPLAY SUBSTRATE USING TWO ETCH MASKS

This application is a divisional application of U.S. patent application Ser. No. 13/277,114 filed on Oct. 19, 2011, which claims priority from Korean Patent Application No. 10-2010-0111038 filed on Nov. 9, 2010 in the Korean Intellectual Property Office, the disclosure of which is incorporated herein by reference in its entirety.

BACKGROUND

1. Field of the Invention

The subject matter disclosed herein relates to a display substrate, a display device, and a method of manufacturing the display substrate.

2. Description of the Related Art

Electronic display devices play an increasingly important role in today's information society, and various kinds of electronic display devices are widely used in diverse industrial fields. As semiconductor technology makes great strides, solidification of various electronic devices with low driving voltage, low power consumption, light weight, and compact size has been achieved. In this regard, there is a need to fabricate a slimmer and lighter flat panel display device having low driving voltage and low power consumption adapted for the new industrial environment.

SUMMARY

It is an objective of the claimed subject matter to prevent a conductive film from being over-etched during the formation of source and drain electrodes and to improve etch profile during the formation of a contact hole.

Aspects of claimed subject matter provide a display substrate, in which the over-etching of a conductive film included in source and drain electrodes is prevented and the etch profile of a contact hole is improved.

Aspects of the claimed subject matter also provide a method of manufacturing the display substrate.

Aspects of the claimed subject matter also provide a display device including the display substrate.

However, aspects of the claimed subject matter are not restricted to the one set forth herein. The above and other aspects will become more apparent to one of ordinary skill in the art to which the claimed subject matter pertains by referencing the detailed description given below.

According to one aspect, there is provided a display substrate including: a substrate in which a pixel region is defined; a gate electrode and a gate pad formed on the substrate; a gate insulating layer formed on the gate electrode and the gate pad; a buffer layer pattern overlaps the gate electrode and is formed on the gate insulating layer; an insulating film pattern formed on the buffer layer pattern; an oxide semiconductor pattern formed on the insulating film pattern; a source electrode formed on the oxide semiconductor pattern; and a drain electrode formed on the oxide semiconductor pattern and is separated from the source electrode.

According to another aspect, there is provided a method of manufacturing a display substrate. The method includes: forming a gate electrode and a gate pad on a substrate in a pixel region is defined; sequentially forming a gate insulating layer, a buffer layer, an insulating film, an oxide semiconductor layer, and a data wiring conductive film on the gate electrode and the gate pad; forming a first mask, which includes a first thickness region and a second thickness region thicker than the first thickness region and disposed on both sides of the first thickness region, on the data wiring conductive film to overlap the gate electrode; forming a data wiring conductive film pattern and an oxide semiconductor pattern by etching the data wiring conductive film and the oxide semiconductor layer using the first etch mask; forming a second etch mask by removing the first thickness region of the first etch mask; and forming source and drain electrodes by etching the data wiring conductive film pattern using the second etch mask, forming a buffer layer pattern by etching the buffer layer using the second etch mask, and forming an insulating film pattern by etching the insulating film using the second etch mask.

According to another aspect, there is provided a display device including: a first display substrate; a second display substrate that faces the first display substrate; and a liquid crystal layer is interposed between the first display substrate and the second display substrate, wherein the first display substrate includes: a substrate in which a pixel region is defined; a gate electrode and a gate pad formed on the substrate; a gate insulating layer formed on the gate electrode and the gate pad; a buffer layer pattern overlaps the gate electrode and is formed on the gate insulating layer; an insulating film pattern formed on the buffer layer pattern; an oxide semiconductor pattern formed on the insulating film pattern; a source electrode formed on the oxide semiconductor pattern; and a drain electrode formed on the oxide semiconductor pattern and is separated from the source electrode.

BRIEF DESCRIPTION OF THE DRAWINGS

The above and other aspects and features will become more apparent by describing in detail exemplary embodiments thereof with reference to the attached drawings, in which.

DETAILED DESCRIPTION

Advantages and features claimed subject matter and methods of accomplishing the same may be understood more readily by reference to the following detailed description of exemplary embodiments and the accompanying drawings. The subject matter may, however, be embodied in many different forms and should not be construed as being limited to the embodiments set forth herein. Rather, these embodiments are provided so that this disclosure will be thorough and complete and will fully convey the concept of the invention to those skilled in the art and will only be defined by the appended claims. Like reference numerals refer to like elements throughout the specification.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Embodiments are described herein with reference to plan and cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of a display substrate, a display device including the same, and a method of manufacturing the display substrate will be described with reference to the attached drawings.

A display substrate according to a first exemplary embodiment of the present invention will now be described with reference to FIGS. 1 through 3.

Figure 1:
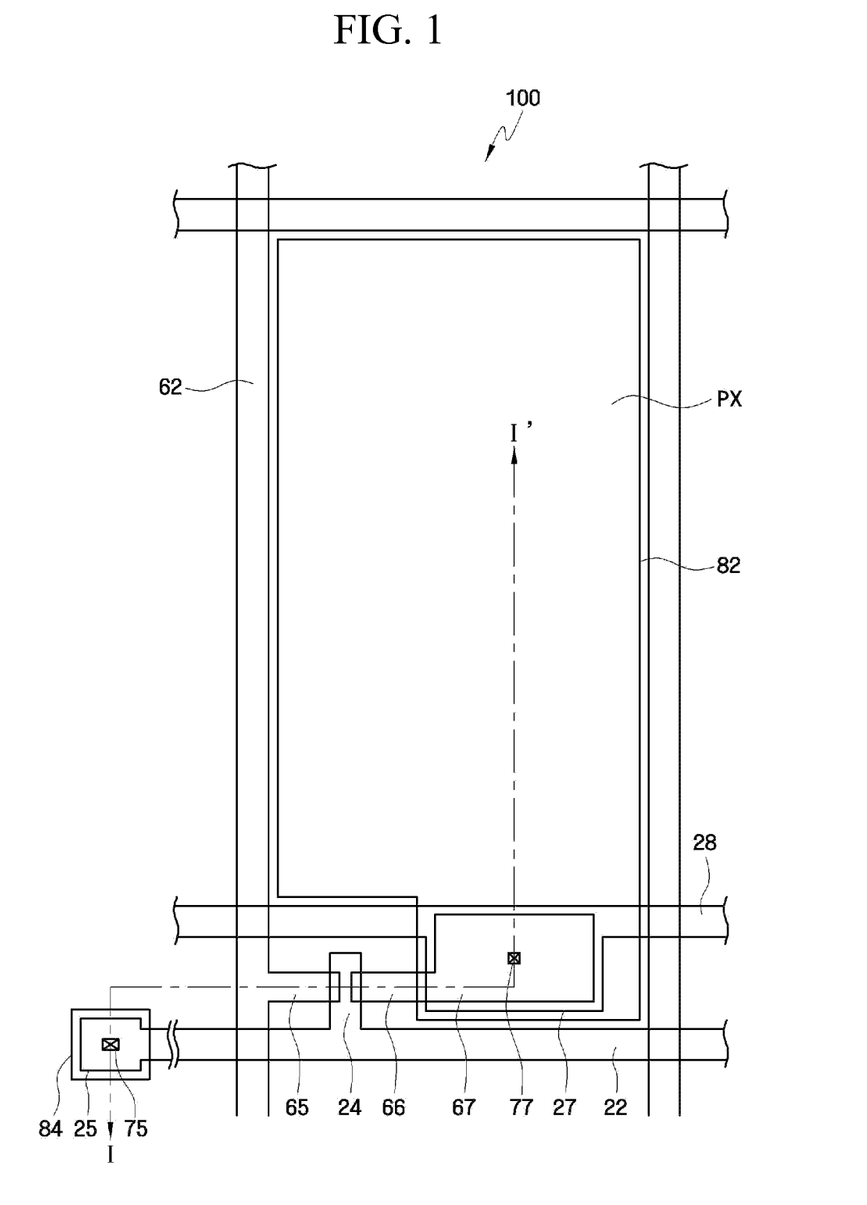
FIG. 1 is a plan view of a display substrate according to a first exemplary embodiment.

FIG. 1 is a plan view of a display substrate 100 according to a first exemplary embodiment. FIGS. 2 and 3 are cross-sectional views taken along the line I-I' of FIG. 1.

Figure 2:
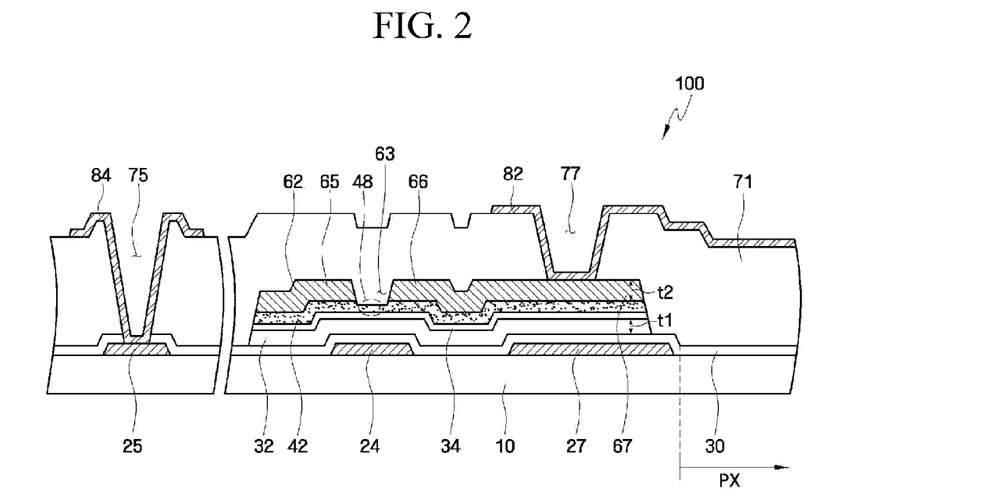
FIGS. 2 and 3 are cross-sectional views taken along the line I-I' of FIG. 1.
Figure 3:
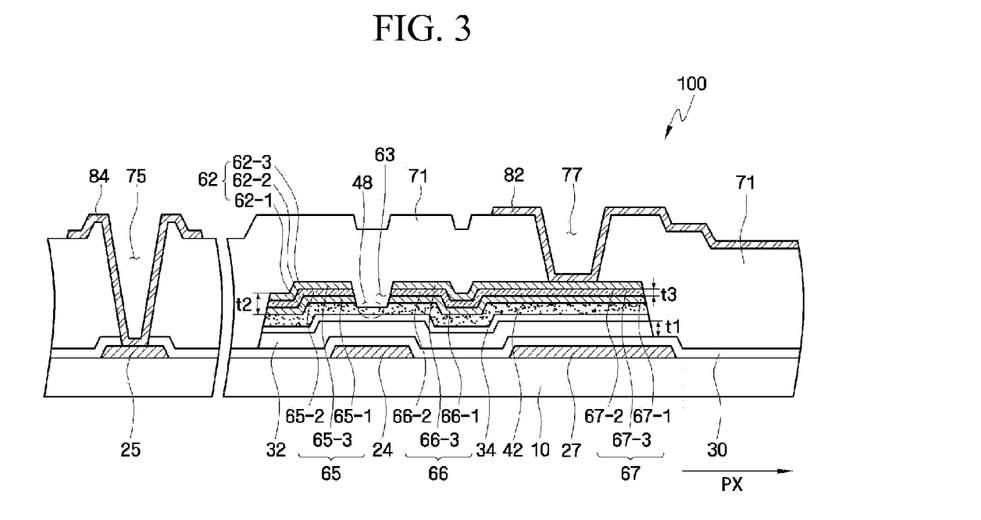

Referring to FIGS. 1 through 3, the display substrate 100 according to the first exemplary embodiment may include a gate wiring (22, 24 and 25), a storage wiring (27 and 28), a gate insulating layer 30, a buffer layer pattern 32, an insulating film pattern 34, an oxide semiconductor pattern 42, a data wiring (62, 65, 66 and 67), a passivation film 71, and a pixel electrode 82 formed on a substrate 10. A pixel region PX in which an image is displayed may be defined in the substrate 10. To this end, the pixel electrode 82 is formed in the pixel region PX.

The substrate 10 may be made of glass, such as soda lime glass or boro silicate glass, or plastic.

The gate wiring (22, 24 and 25) which delivers a gate signal is formed on the substrate 10. The gate wiring (22, 24 and 25) includes a gate line 22, a gate electrode 24, and a gate pad 25. The gate line 22 extends in a direction, e.g., a horizontal direction, the gate electrode 24 of a TFT protrudes from the gate line 22, and the gate pad 25 is disposed at an end of the gate line 22 and receives an external electrical signal.

A storage wiring (27 and 28) is also formed on the substrate 10. The storage wiring (27 and 28) delivers a common voltage and includes a storage electrode 27 and a storage line 28. The storage line 28 may extend in the horizontal direction to be substantially parallel to the gate line 22. The storage electrode 27 may be wider than the storage line 28. The storage electrode 27 is overlapped by a drain electrode extension portion 67 connected to the pixel electrode 82, which will be described later, to form a storage capacitor that improves the charge storage capability of a pixel. The shape and disposition of the storage wiring (27 and 28) may vary. If sufficient storage capacitance can be generated by the overlapping of the pixel electrode 82 and the gate line 22, the storage wiring (27 and 28) may not be formed.

The gate wiring (22 and 24) and the storage wiring (27 and 28) may be made of aluminum (Al)-based metal such as Al and an Al alloy, silver (Ag)-based metal such as Ag and an Ag alloy, copper (Cu)-based metal such as Cu and a Cu alloy, molybdenum (Mo)-based metal such as Mo and a Mo alloy, manganese (Mn)-based metal such as Mn and a Mn alloy, chrome (Cr), titanium (Ti), or tantalum (Ta).

In addition, the gate wiring (22 and 24), the storage electrode 27, and the storage line 28 may have a multi-film structure composed of two conductive films (not shown) with different physical characteristics. One of the two conductive films may be made of metal with low resistivity, such as Al-based metal, Ag-based metal or Cu-based metal, in order to reduce a signal delay or a voltage drop of the gate wiring (22 and 24), the storage electrode 27, and the storage line 28. The other one of the conductive films may be made of a different material, in particular, a material having superior contact characteristics with zinc oxide (ZnO), indium tin oxide (ITO) and indium zinc oxide (IZO), such as Mo-based metal, Cr, Ti, or Ta. Examples of multi-film structures include a chrome lower film and an aluminum upper film, an aluminum lower film and a molybdenum upper film, a copper-manganese (CuMn) alloy lower film and a copper upper film, and a titanium lower film and a copper upper film. However, the claimed subject matter is not limited thereto. The gate wiring (22 and 24) and the storage wiring (27 and 28) may be made of various metals and conductors.

The gate insulating layer 30 is formed on the gate wiring (22 and 24), the storage wiring (27 and 28), and portions of the substrate 10 on which the gate wiring (22 and 24) and the storage wiring (27 and 28) are not formed. The gate insulating layer 30 may be made of an inorganic insulating material such as silicon oxide (SiOx), or may be made of an organic insulating material such as benzocyclobutene (BCB), an acrylic material, or polyimide. The gate insulating layer 30 covers the gate wiring (22 and 24) and the storage wiring (27 and 28).

The buffer layer pattern 32 made of, e.g., silicon nitride (SiNx) is formed on the gate insulating layer 30. The buffer layer pattern 32 overlaps the gate electrode 24 and the oxide semiconductor pattern 42 which will be described later. Accordingly, the buffer layer pattern 32 may not be disposed on the gate pad 25 and on the pixel region PX in which the pixel electrode 82 is formed. That is, the buffer layer pattern 32 may be formed on a region of the gate insulating layer 30 which is overlapped by the oxide semiconductor pattern 42 which will be described later.

The buffer layer pattern 32 protects a conductive film that forms source and drain electrodes from an etching gas when the source and drain electrodes are formed as will be described later. The etching gas may be, for example, a chlorine (Cl)-based etching gas. The buffer layer pattern 32 may have a different etch selectivity from the gate insulating layer 30.

The insulating film pattern 34 made of, e.g., SiOx is disposed on the buffer layer pattern 32. The insulating film pattern 34 is interposed between the buffer layer pattern 32 and the oxide semiconductor pattern 42. Similar to the buffer layer pattern 32, the insulating film pattern 34 may not be disposed on the gate pad 25 and on the pixel region PX in which the pixel electrode 82 is formed. The insulating film pattern 34 insulates a channel region of the oxide semiconductor pattern 42. To this end, the insulating film pattern 34 may have a low concentration of hydrogen ions. The insulating film pattern 34 and the buffer layer pattern 32 may have different etch selectivities.

The oxide semiconductor pattern 42 is formed on the insulating film pattern 34. The oxide semiconductor pattern 42 may be made of an oxide of a material selected from zinc (Zn), indium (In), gallium (Ga), tin (Sn), hafnium (Hf), and a combination of the same. For example, the oxide semiconductor pattern 42 may be made of a mixed oxide selected from InZnO, InGaO, InSnO, ZnSnO, GaSnO, GaZnO, GaZnSnO, GaInZnO, HfInZnO, and ZnO.

The oxide semiconductor pattern 42 has 2 to 100 times greater effective charge mobility than hydrogenated amorphous silicon and has an on/off current ratio of $10^5$ to $10^8$. Thus, the oxide semiconductor pattern 42 shows excellent semiconductor properties. Furthermore, since the band gap of the oxide semiconductor pattern 42 is between 3.0 and 3.5 eV, leakage photoelectric current with respect to visible light is not generated. Accordingly, instantaneous afterimage of oxide TFTs may be prevented, making it unnecessary to form a light blocking layer under the oxide TFTs, and thus increasing the aperture ratio of the TFT substrate 100. In order to enhance the properties of an oxide semiconductor, a Group 3, Group 4, Group 5, or transition element from the periodic table may be supplementarily included. Additionally, although the oxide semiconductor pattern 42 is in an amorphous state, it has a high effective charge mobility, and existing manufacturing processes for amorphous silicon may be used without any change, such that application to large display devices is possible.

The oxide semiconductor pattern 42 may be patterned in substantially the same shape as the data wiring (62, 65, 66 and 67) which will be described later, except for a channel region of the TFT. This is because the oxide semiconductor pattern 42 and the data wiring (62, 65, 66 and 67) are patterned using one etch mask. This will be described in further detail later.

The oxide semiconductor pattern 42 may include a channel region 48 overlapped by a gap 63 interposed between a source electrode 65 and a drain electrode 66. A top surface of the channel region 48 of the oxide semiconductor pattern 42 may be lower than that of the other region of the oxide semiconductor pattern 42. That is, the top surface of the channel region 42 may be recessed in the direction of the substrate 10.

The data wiring (62, 65, 66 and 67) is formed on the oxide active pattern 42 and includes a data line 62, the source electrode 65, the drain electrode 66, and the drain electrode extension portion 67. The data line 62 extends, e.g., in a vertical direction and intersects the gate line 22 to define a pixel. The source electrode 65 branches from the data line 62 and extends onto the oxide semiconductor pattern 42. The drain electrode 66 is separated from the source electrode 65 and is formed on the oxide semiconductor pattern 42 to face the source electrode 65 with respect to the gate electrode 26 or the channel region of the TFT. The drain electrode extension portion 67 has a large area, extends from the drain electrode 66, and overlaps the storage electrode 27.

The data wiring (62, 65, 66 and 67) may contact the oxide semiconductor pattern 42 to form an ohmic contact. In order to form an ohmic contact, the data wiring (62, 65, 66 and 67) may have a single-film structure made of Ni, Co, Ti, Ag, Cu, Mo, Al, Be, Nb, Au, Fe, Se, Mn or Ta, or a multi-film structure including multiple conductive films. Examples of multi-film structures having multiple conductive films include double-film structures such as Ta/Al, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd, Mo/Nb, Mn (Mn alloy)/Cu. As shown in FIG. 3, the data wiring (62, 65, 66 and 67) may also have a triple-film structure including first through third conductive film patterns 62-1 through 62-3, 65-1 through 65-3, 66-1 through 66-3 and 67-1 through 67-3. The first through third conductive film patterns 62-1 through 62-3, 65-1 through 65-3, 66-1 through 66-3 and 67-1 through 67-3 may be, for example, Ti/Al/Ti, Ta/Al/Ta, Ti/Al/TiN, Ta/Al/TaN, Ni/Al/Ni, Co/Al/Co, or Mo/Al/Mo. The data wiring (62, 65, 66 and 67) may also be made of materials other than the above materials.

The gap 63 is formed between the source electrode 65 and the drain electrode 66. The gap 63 electrically insulates the source electrode 65 from the drain electrode 66. A region of the oxide semiconductor pattern 42 which is overlapped by the gap 63 is the channel region 48. Accordingly, the channel region 48 may be externally exposed, unlike the other region of the oxide semiconductor pattern 42.

A thickness t1 of the buffer layer pattern 32 may be proportional to a thickness t2 of the data wiring (62, 65, 66 and 67). This is because the buffer layer pattern 32 prevents a conductive material contained in the data wiring (62, 65, 66 and 67) from being damaged by an etching gas during the formation of the data wiring (62, 65, 66 and 67). For example, the data wiring (62, 65, 66 and 67) may contain aluminum, and the aluminum may be vulnerable to a Cl-based etching gas. In this case, the damage to the aluminum contained in the data wiring (62, 65, 66 and 67) can be prevented by inducing a reaction between a buffer layer 31 (see FIG. 7A) before being formed into the buffer layer pattern 32 and the Cl-based etching gas. When the data wiring (62, 65, 66 and 67) is formed to a relatively larger thickness t2, a conductive material (e.g., aluminum) contained in the data wiring (62, 65, 66 and 67) may become thicker. To prevent the thicker conductive material from being damaged, the thickness t1 of the buffer layer 31 (see FIG. 7A) should be proportional to the thickness of the thicker conductive material. Accordingly, the thickness t1 of the buffer layer pattern 32 formed by patterning the buffer layer 31 (see FIG. 7A) is proportional to the thickness t2 of the data wiring (62, 65, 66 and 67).

When the data wiring (62, 65, 66 and 67) has a multi-film structure including multiple conductive films, the thickness t1 of the buffer layer pattern 32 may be proportional to that of a conductive film which contains a conductive material vulnerable to a Cl-based etching gas, among the multiple conductive films. For example, the data wiring (62, 65, 66 and 67) may have a triple-film structure including the first through third conductive film patterns 62-1 through 62-3, 65-1 through 65-3, 66-1 through 66-3 and 67-1 through 67-3, as shown in FIG. 3. In addition, the conductive material vulnerable to the Cl-based etching gas may be aluminum, and the second conductive film patterns 62-2, 65-2, 66-2 and 67-2 may contain aluminum. In this case, the second conductive film patterns 62-2, 65-2, 66-2 and 67-2 may be vulnerable to the Cl-based etching gas during the formation of the data wiring (62, 65, 66 and 67). To prevent the damage to the aluminum-containing second conductive film patterns 62-2, 65-2, 66-2 and 67-2, the buffer layer 31 (see FIG. 7A) may be formed to the thickness t1 that is proportional to a thickness t3 of the second conductive film patterns 62-2, 65-2, 66-2 and 67-2. Accordingly, the thickness t1 of the buffer layer pattern 32 formed by patterning the buffer layer 31 (see FIG. 7A) is proportional to the thickness t3 of the second conductive film patterns 62-2, 65-2, 66-2 and 67-2.

The buffer layer pattern 32, the insulating film pattern 34, the oxide semiconductor pattern 42, and the source and drain electrodes 65 and 66 of the data wiring (62, 65, 66 and 67) are formed using a first or second etch mask 110 (see FIG. 8) or 120 (see FIG. 10) which will be described later. The buffer layer pattern 32, the insulating film pattern 34, the oxide semiconductor pattern 42, and the source and drain electrodes 65 and 66 of the data wiring (62, 65, 66 and 67) may have substantially the same lateral profile. In addition, the lateral profiles of the buffer layer pattern 32, the insulating film pattern 34, the oxide semiconductor pattern 42, and the source and drain electrodes 65 and 66 of the data wiring (62, 65, 66 and 67) may be formed as a single profile.

A passsivation film 71 is formed on the data wiring (62, 65, 66 and 67), a region of the oxide semiconductor pattern 42 which corresponds to a region between the source electrode 65 and the drain electrode 66, and the gate insulating layer 30. The passivation film 71 may be made of an inorganic material such as SiOx, an organic material having photosensitivity and superior planarization properties, or a low-k insulating material formed by plasma enhanced chemical vapor deposition (PECVD), such as a-Si:C:O or a-Si:O:F. If the passivation film 71 is made of, e.g., SiOx, since the oxide semiconductor pattern 42 and the SiOx layer are disposed adjacent to each other, the deterioration of TFT properties of the oxide semiconductor pattern 42 can be prevented.

The passivation film 71 may be the same etch selectivity as the gate insulating layer 30. This improves the lateral profile of a second contact hole 75 exposing the gate pad 25, thus preventing contact defects.

A first contact hole 77 exposing the drain electrode extension portion 67 is formed in the passivation film 71. The pixel electrode 82, which will be described later, and the drain electrode extension portion 67 may be electrically connected to each other by the first contact hole 77.

The pixel electrode 82 is formed on the passivation film 71 along the shape of a pixel. The pixel electrode 82 is electrically connected to the drain electrode extension portion 67 by the first contact hole 77. The pixel electrode may be made of a transparent conductor such as ITO or IZO or a reflective conductor such as aluminum. Meanwhile, a bridge electrode 84 made of the same material as the pixel electrode 82 is disposed on the gate pad 25. The bridge electrode 82 is electrically connected to the gate pad 25 by the second contact hole 75.

Figure 4:
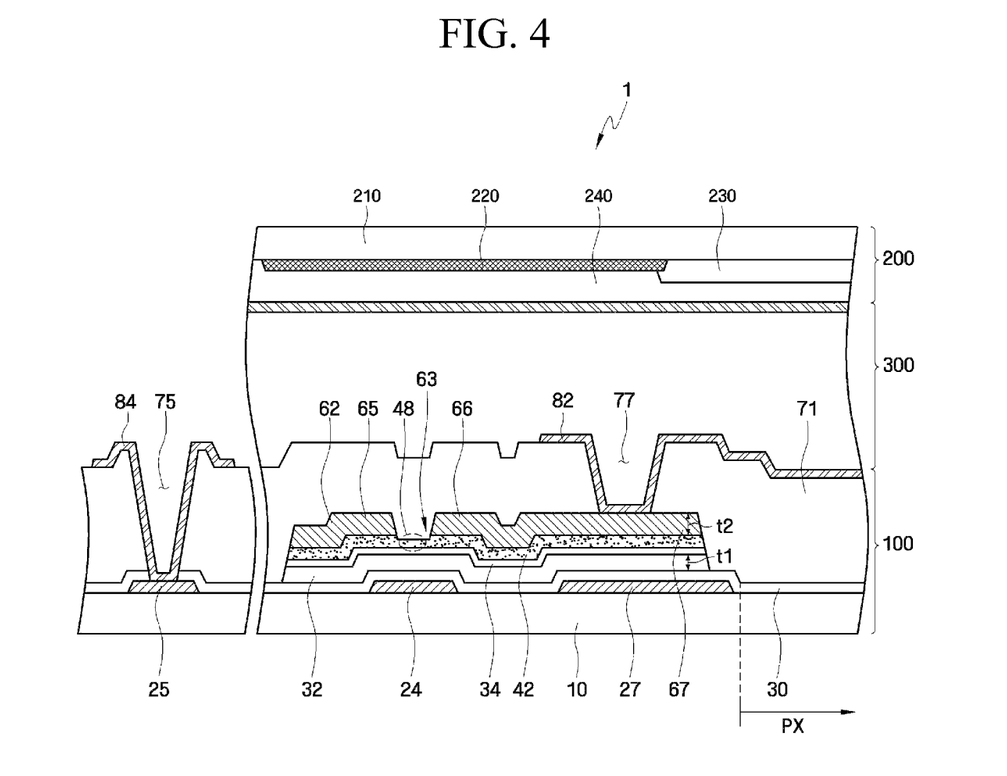
FIG. 4 is a cross-sectional view of a display device according to a second exemplary embodiment.

Hereinafter, a display device according to a second exemplary embodiment will be described with reference to FIG. 4. FIG. 4 is a cross-sectional view of a display device 1 according to a second exemplary embodiment. For simplicity, elements having the same functions as those shown in the drawings for the first exemplary embodiment are indicated by like reference numerals, and thus their description will be omitted.

Referring to FIG. 4, the display device 1 according to the second exemplary embodiment includes a first display substrate 100, a second display substrate 200, and a liquid crystal layer 300. The first display substrate 100 is substantially the same as the above-described display substrate 100 according to the first exemplary embodiment, and any repetitive detailed description thereof will hereinafter be omitted.

The second display substrate 200 will now be described below. A black matrix 220 for preventing leakage of light is formed on an insulating substrate 210. The black matrix 220 is formed in regions other than a region that faces a pixel electrode 82, thereby defining a pixel region PX. The black matrix 220 may be made of an opaque organic material or an opaque metal.

For color representation, color filters 230 are formed on the insulating substrate 210. Specifically, the color filters 230 are red (R), green (G) and blue (B) filters formed to represent colors. Each of the color filters 230 absorb or pass light in a predetermined wavelength band by using R, G or B pigments included therein in order to represent R, G or B color. The color filters 230 may generate various colors by additively mixing R, G and B light that pass therethrough. Although not shown in the drawing, the color filters 320 may also be formed on the first display substrate 100. In this case, the color filters 230 may not be formed on the second display substrate 200.

An overcoat layer 240 is formed on the black matrix 220 and the color filters 230 in order to reduce a step difference between them. The overcoat layer 240 is made of a transparent organic material, protects the color filters 230 and the black matrix 220, and insulates the black matrix 220 and the color filters 230 from a common electrode 250 which will be described later.

The common electrode 250 is formed on the overcoat layer 240. The common electrode 250 may be made of a transparent conductive material, such as ITO or IZO.

A liquid crystal layer 300 is interposed between the first display substrate 100 and the second display substrate 200. The voltage difference between the pixel electrode 82 and the common electrode 250 determines transmittance.

Figure 5:
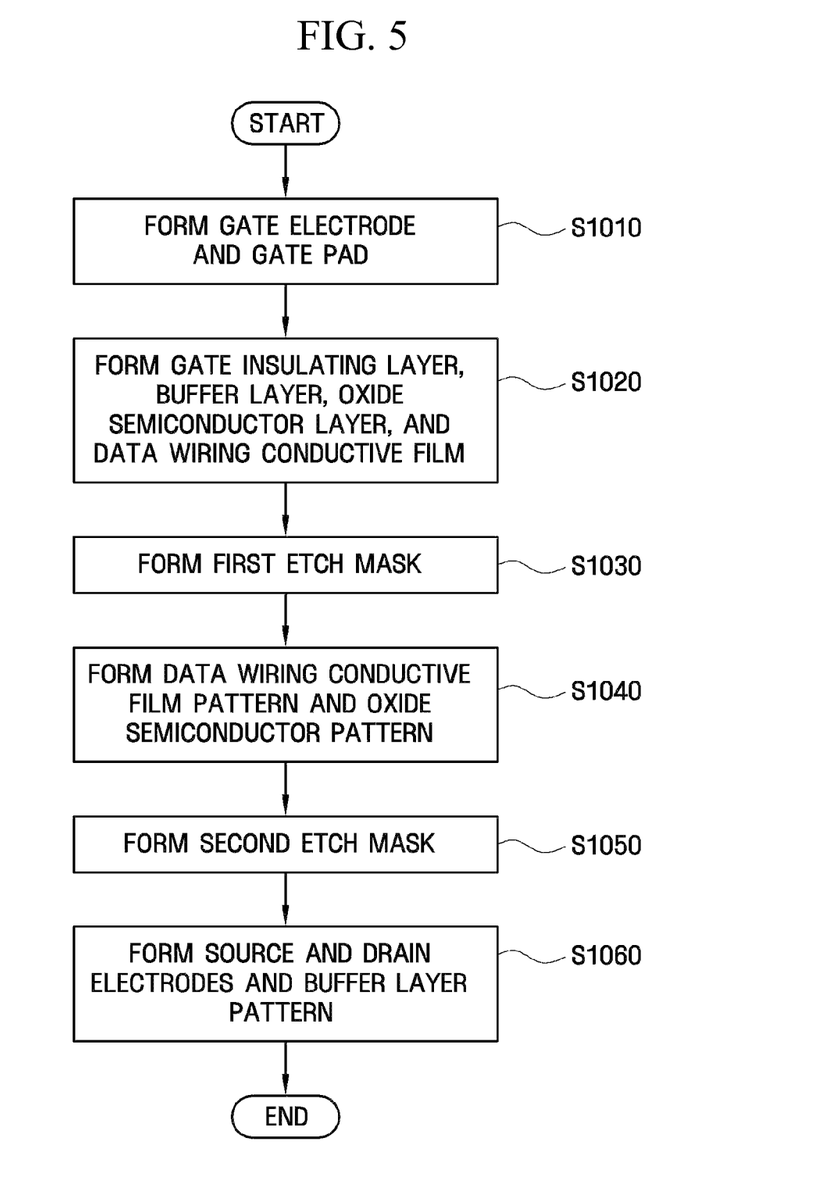
FIG. 5 is a flowchart illustrating a method of manufacturing a display substrate according to a third exemplary embodiment.

Hereinafter, a method of manufacturing a display substrate according to a third exemplary embodiment will be described with reference to FIGS. 1 through 3 and 5 through 14. For simplicity, elements having the same functions as those shown in the drawings for the first exemplary embodiment are indicated by like reference numerals, and thus their description will be omitted or simplified. FIG. 5 is a flowchart illustrating a method of manufacturing a display substrate according to a third exemplary embodiment. FIGS. 6 through 14 are cross-sectional views respectively illustrating processes in the method of manufacturing a display substrate according to the third exemplary embodiment.

Figure 6:
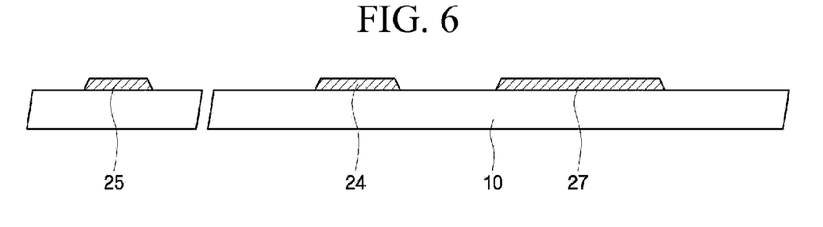
FIGS. 6 through 14 are cross-sectional views respectively illustrating processes in the method of manufacturing a display substrate according to the third exemplary embodiment.

Referring to FIG. 6, a gate and storage wiring metal film (not shown) is stacked on a substrate 10 and then patterned to form a gate line 22, a gate electrode 24, a gate pad 25, a storage electrode 27, and a storage line 28 (operation S1010). Here, the gate line 22, the gate electrode 24, the gate pad 25, the storage electrode 27, and the storage line 28 may have a monolayer structure or a multilayer structure. The gate and storage wiring metal film may be deposited by, e.g., sputtering, and the deposited gate and storage wiring metal film may be wet-etched or dry-etched to form the gate line 22, the gate electrode 24, the gate pad 25, the storage electrode 27, and the storage line 28. In the wet-etching process, an etchant, such as phosphoric acid, nitric acid or acetic acid, may be used. In the dry-etching process, a Cl-based etching gas, such as $Cl_2$ or $BCl_3$, may be used. Since the dry-etching process is an anisotropic etching process, a finer gate wiring can be formed by dry-etching a multilayer gate wiring metal film.

Figure 7A:
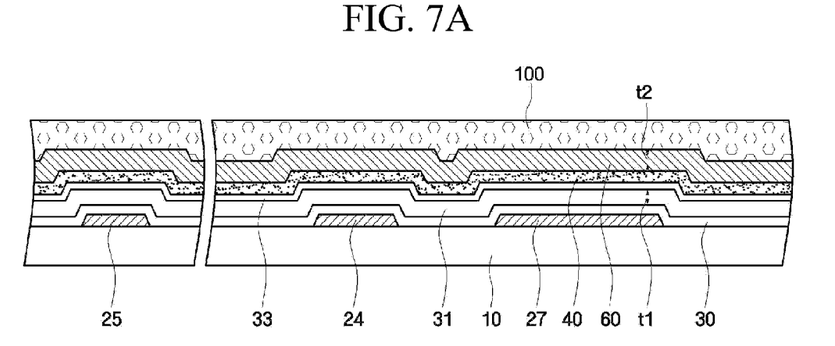

Referring to FIG. 7A, a gate insulating layer 30, a buffer layer 31, an insulating film 33, an oxide semiconductor layer 40, and a data wiring conductive film 60 are sequentially formed on the resultant structure of FIG. 6 (operation S1020). The buffer layer 31 and the gate insulating layer 30 may have different etch selectivities. Also, the insulating film 33 and the buffer layer 31 may have different etch selectivities.

The gate insulating layer 30, the buffer layer 31 and the insulating film 33 may be deposited by, e.g., PECVD or reactive sputtering. Here, the gate insulating layer 30 may be formed of, e.g., SiOx. In addition, the buffer layer 31 may be made of a material that reacts with a Cl-based etching gas used in the process of etching the data wiring conductive film 60. For example, the buffer layer 31 may be made of SiNx. The insulating film 33 may be made of a material that can prevent the deterioration of the oxide semiconductor pattern 42. For example, the insulating film 33 may be made of SiOx. Meanwhile, the oxide semiconductor layer 40 and the data wiring conductive film 60 are successively deposited on the insulating film 33 by, e.g., sputtering.

Figure 7B:
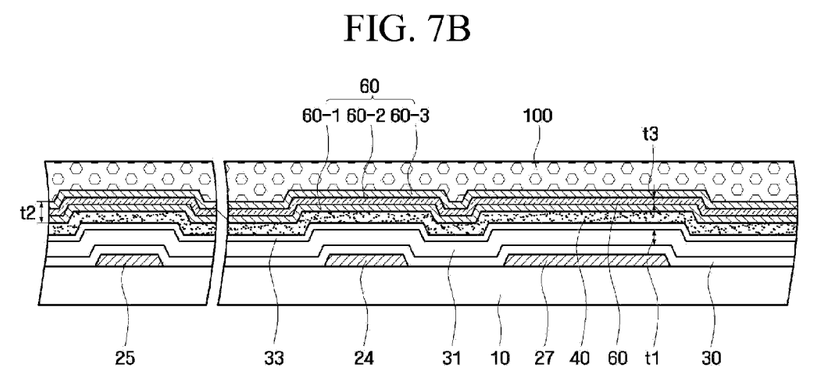

As described above, a thickness t1 of the buffer layer 31 may be proportional to a thickness t2 of the data wiring conductive film 60. When the data wiring conductive film 60 has a multi-film structure including multiple conductive films (60-1 through 60-3) as shown in FIG. 7B, the buffer layer 31 thickness may be proportional to that of a conductive film which contains a conductive material vulnerable to a Cl-based etching gas, among the multiple conductive films (60-1 through 60-3). For example, the data wiring conductive film 60 may have a triple-film structure including first through third conductive films 60-1 through 60-3, and the second conductive film 60-2 may contain a material vulnerable to a Cl-based etching gas. In this case, the thickness t1 of the buffer layer 31 may be proportional to a thickness t3 of the second conductive film 60-2. Here, the second conductive film 60-2 may be made of, e.g., aluminum, and the first and third conductive films 60-1 and 60-3 may be made of molybdenum. Since the reasons for the relationship between the thickness t1 of the buffer layer 31 and that of the data wiring conductive film 60 have been described above, any repetitive description thereof will be omitted.

Referring to FIGS. 7A and 7B, a photoresist film 100 is formed on the data wiring conductive film 60. The photoresist film 100 may be formed by coating photoresist on the substrate 10 using, e.g., a spin coating method and then soft-baking the photoresist.

Figure 8:
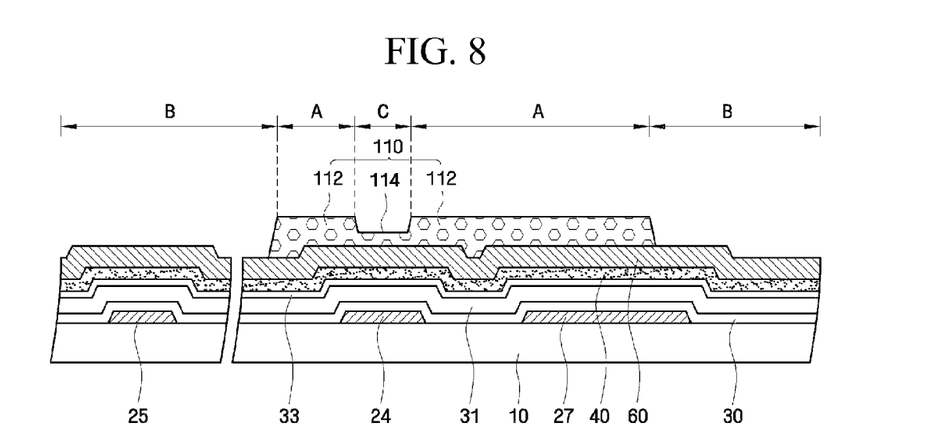

Referring to FIG. 8, the photoresist film 100 is exposed to light using a mask and then developed, thereby forming a first etch mask 110 having a first thickness region 114 and a second thickness region 112 (operation S1030).

The first thickness region 114 is disposed in a channel region C of a TFT, that is, disposed between a source electrode 65 (see FIG. 2) and a drain electrode 66 (see FIG. 2). The second thickness region 112 is disposed on both sides of the first thickness region 114. The second thickness region 112 is formed thicker than the first thickness region 114. Meanwhile, the photoresist film 100 in a region B other than the channel region C of the TFT and a data-wiring region A is completely removed. A ratio of a thickness of the first thickness region 114 to that of the second thickness region 112 remaining in the data-wiring region A may vary according to processing conditions in etching processes which will be described later.

Various methods may be used to form the first etch mask 110 having different thicknesses at different positions. For example, a mask having a slit, a lattice pattern, or a semi-transparent film may be used to control the amount of light. In addition, a photoresist film made of a material that can reflow may be used. In this case, the photoresist film may be exposed to light by using a conventional mask that is divided into a transparent region through which light can completely pass and a semi-transparent region through which light cannot completely pass. Then, the photoresist film may be developed and reflowed, so that part of the photoresist film can flow to a region without the photoresist film. As a result, the first thickness region 114 may be formed.

Figure 9:
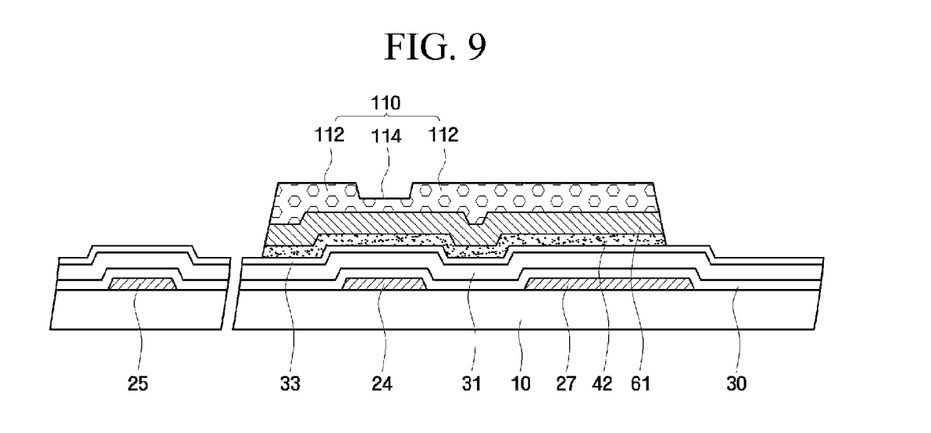

Referring to FIG. 9, the data wiring conductive film 60 and the oxide semiconductor layer 40 are etched using the first etch mask 110 to form a data wiring conductive film pattern 61 and an oxide semiconductor pattern 42 (operation S1040). The above etching process may be a wet-etching process or a dry-etching process. In the wet-etching process, an etchant, such as phosphoric acid, nitric acid or acetic acid, may be used. In the dry-etching process, a Cl-based etching gas, such as $Cl_2$ or $BCl_3$, may be used.

After the etching of the data wiring conductive film 60 and the oxide semiconductor layer 40, only the data wiring conductive film pattern 61 and the oxide semiconductor pattern 42 remain as shown in FIG. 9, whereas all portions of the data wiring conductive film 60 and the oxide semiconductor layer 40 excluding the oxide semiconductor pattern 42 and the data wiring conductive film pattern 61 are removed, thereby exposing the insulating film 33 thereunder. Here, the remaining data wiring conductive film pattern 61 has the same shape as a data wiring (62, 65, 66 and 67) (see FIG. 2), except that the data wiring conductive film pattern 61 is not separated into the source electrode 65 (see FIG. 2) and the drain electrode 66 (see FIG. 2).

Figure 10:
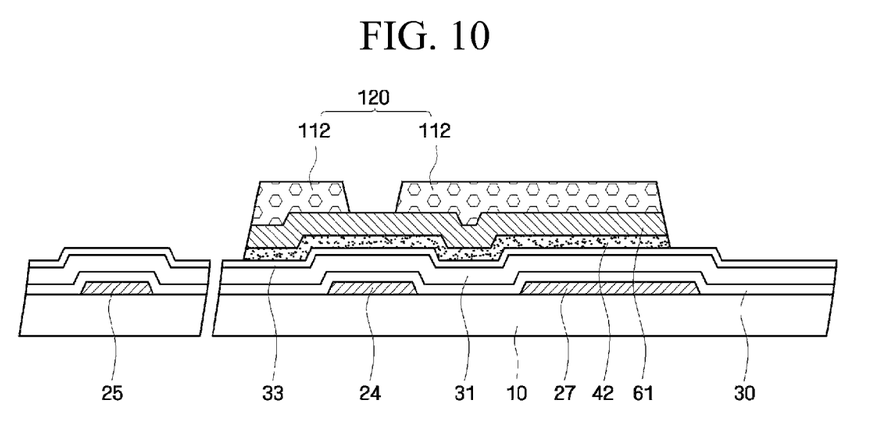

Referring to FIG. 10, the first etch mask 110 is etched back to remove the first thickness region 114 of the first etch mask 110. Accordingly, a second etch mask 120 is formed (operation S1050). The removal of the first thickness region 114 results in the exposure of a region of the data wiring conductive film pattern 61 which corresponds to the first thickness region 114.

Figure 11:
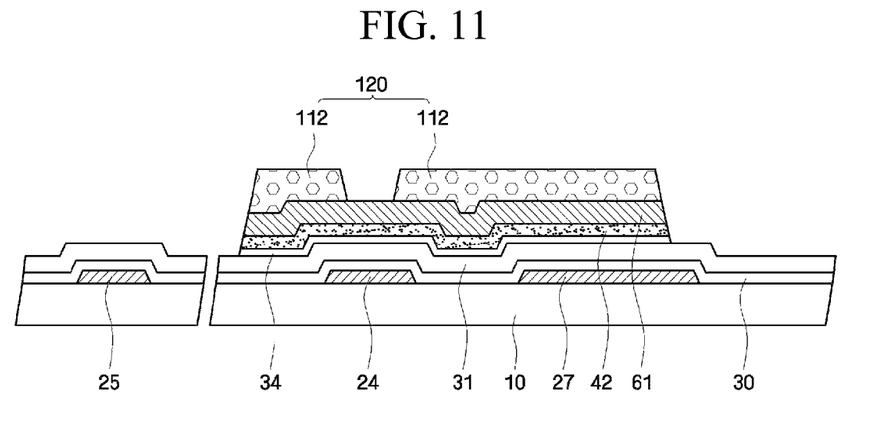

Referring to FIG. 11, the insulating film 33 is etched using the second etch mask 120, thereby forming an insulating film pattern 34. The insulating film 33 may be, for example, dry-etched. In the etching process, the entire insulating film 33 excluding its region corresponding to the oxide semiconductor pattern 42 thereon is removed. That is, the insulating film 33 formed on the gate pad 25 and a pixel region PX is removed. Accordingly, the buffer layer 31 excluding its region corresponding to the insulating film pattern 34 thereon is exposed.

Figure 12:
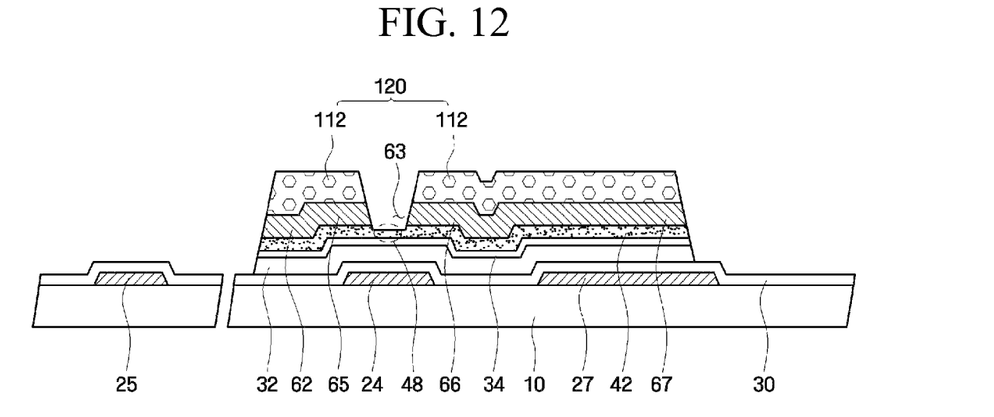

Referring to FIG. 12, the data wiring conductive film pattern 61 exposed by the second etch mask 120 is etched to form the source electrode 65 and the drain electrode 66. The etching of the data wiring conductive film pattern 61 may cause a channel region of the oxide semiconductor pattern 42 to be partially etched. In addition, the buffer layer 31 is etched, thereby forming a buffer layer pattern 32 (operation S1060). The data wiring conductive film pattern 61 may be, for example, dry-etched.

An etching gas used here may be a Cl-based etching gas such as $Cl_2$ or $BCl_3$. Since a dry-etching process is an anisotropic etching process, a finer data wiring can be formed by dry-etching the data wiring conductive film pattern 61. However, if a wet-etching process, which is an isotropic etching process, is used to etch the data wiring conductive film pattern 61, already exposed sides of the data wiring conductive film pattern 61 may also be etched, resulting in over-etching of the data wiring (62, 65, 66 and 67) and thus making it difficult to form fine patterns.

If the data wiring conductive film pattern 61 contains aluminum, a Cl-based etching gas may be attached to the aluminum during the etching of the data wiring conductive film pattern 61, thereby corroding the aluminum. However, the buffer layer 31 may react with the Cl-based etching gas and thus prevent the Cl-based etching gas from being attached to the aluminum. Here, the buffer layer 31 excluding its region corresponding to the insulating film pattern 34 thereon may react with the Cl-based etching gas. Accordingly, the buffer layer 31 excluding its region corresponding to the insulating film pattern 34 is removed to form a buffer layer pattern 32. Additionally, the buffer layer 31 formed on the gate pad 25 and the pixel region PX is removed. If the data wiring conductive film pattern 61 contains aluminum, the buffer layer 31 can effectively prevent the corrosion of the aluminum, as described above.

The buffer layer pattern 32, the insulating film pattern 34, the oxide semiconductor pattern 42, and the data wiring (62, 65, 66 and 67) formed using the first or second etch mask 110 or 120 may have substantially the same lateral profile. Furthermore, the lateral profiles of the buffer layer pattern 32, the insulating film pattern 34, the oxide semiconductor pattern 42, and the data wiring (62, 65, 66 and 67) formed using the first or second etch mask 110 or 120 may be formed as a single profile.

Figure 13:
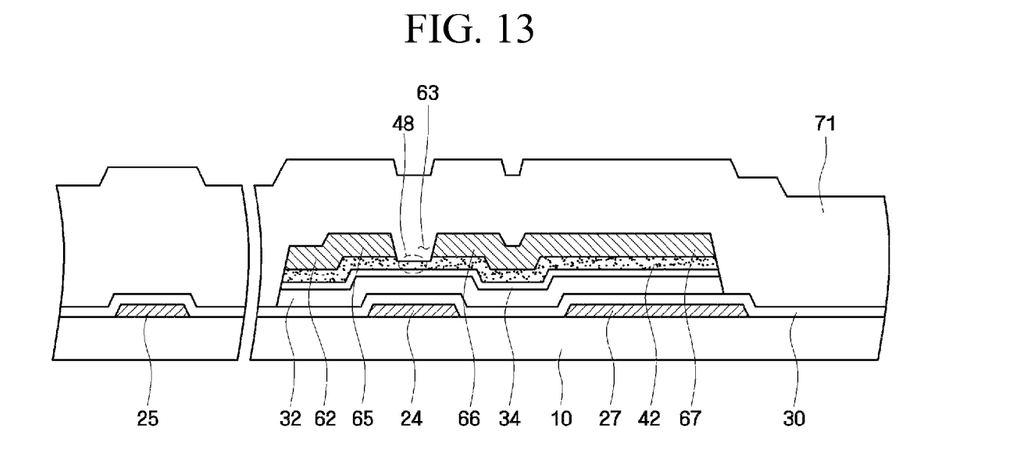

Referring to FIG. 13, the second etch mask 120 shown in FIG. 12 is removed, and a passivation film 71 is formed on the entire surface of the substrate 10 having the second etch mask 120 removed. The passivation film 71 may be formed of a material having the same etch selectivity as the gate insulating layer 30, such that a second contact hole 75 (see FIG. 14) to be formed in a subsequent process has a good lateral profile. When the gate insulating layer 30 is made of, e.g., SiOx, the passivation film 71 may also be made of SiOx.

Figure 14:
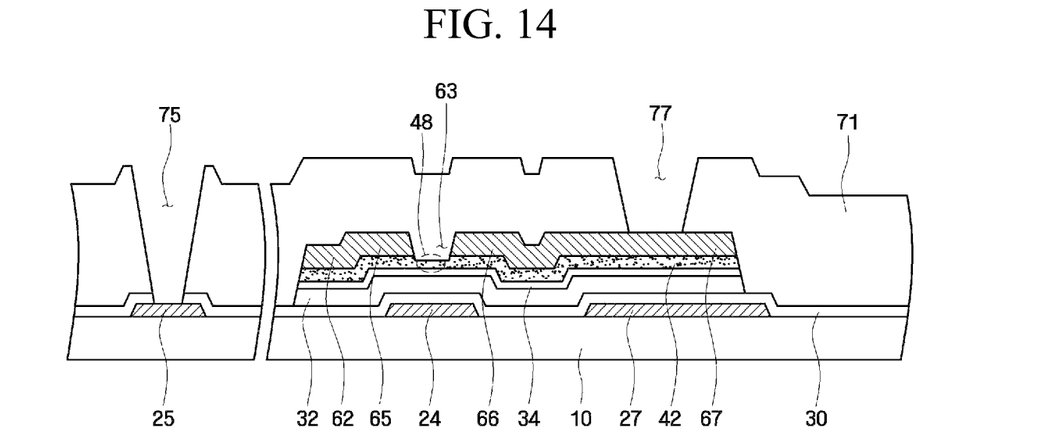

Referring to FIG. 14, a first contact hole 77 and a second contact hole 75 are formed in the passivaton film 71. The first contact hole 77 exposes a drain electrode extension portion 67 while the second contact hole 75 exposes the gate pad 25.

Referring to FIG. 2, a conductor such as ITO or IZO is deposited on the resultant structure of FIG. 14 by, e.g., sputtering and is then patterned to form a pixel electrode 82 on the pixel region PX and a bridge electrode 84 on the gate pad 25.

While the claimed subject matter has been particularly shown and described with reference to exemplary embodiments thereof, it will be understood by those of ordinary skill in the art that various changes in form and detail may be made therein without departing from the spirit and scope as defined by the following claims. The exemplary embodiments should be considered in a descriptive sense only and not for purposes of limitation.

What is claimed is:

1. A method of manufacturing a display substrate, the method comprising:
    forming a gate electrode and a gate pad on a substrate in which a pixel region is defined;
    sequentially forming a gate insulating layer, a buffer layer, an insulating film, an oxide semiconductor layer, and a data wiring conductive film on the gate electrode and the gate pad;
    forming a first etch mask, which comprises a first thickness region and a second thickness region thicker than the first thickness region and disposed on both sides of the first thickness region, on the data wiring conductive film to overlap the gate electrode;
    forming a data wiring conductive film pattern and an oxide semiconductor pattern by etching the data wiring conductive film and the oxide semiconductor layer using the first etch mask;
    forming a second etch mask by removing the first thickness region of the first etch mask; and
    forming source and drain electrodes by etching the data wiring conductive film pattern using the second etch mask, forming a buffer layer pattern by etching the buffer layer using the second etch mask, and forming an insulating film pattern by etching the insulating film using the second etch mask.

2. The method of claim 1, wherein a thickness of the buffer layer is less than that of the data wiring conductive film.

3. The method of claim 2, wherein the data wiring conductive film comprises multiple conductive films, wherein at least one of the multiple conductive films contains aluminum.

4. The method of claim 3, wherein the thickness of the buffer layer is less than that of the conductive film containing the aluminum.

5. The method of claim 2, wherein the data wiring conductive film pattern is etched using a dry-etching method.

6. The method of claim 5, wherein the dry-etching method uses a chlorine (Cl)-based etching gas.

7. The method of claim 1, wherein the buffer layer and the insulating film on the gate pad and the pixel region are removed in the forming of the buffer layer pattern and the insulating film pattern.

8. The method of claim 7, further comprising forming a passivation film on the gate pad.

9. The method of claim 8, further comprising forming a contact hole to expose the gate pad by etching the passivation film and the gate insulating layer.

10. The method of claim 9, wherein the passivation film has the same etch selectivity as the gate insulating layer.

11. The method of claim 1, wherein the buffer layer has a different etch selectivity from the gate insulating layer or the insulating film.

12. The method of claim 11, wherein the buffer layer contains SiNx, and the gate insulating layer and the insulating film contain SiOx.

13. The method of claim 1, wherein the forming of the source and drain electrodes further comprises forming a gap between the source and drain electrodes.

14. The method of claim 13, wherein the oxide semiconductor pattern comprises a channel region overlapped by the gap, wherein the channel region is recessed in a direction toward the substrate.

* * * * *